(12) United States Patent
Klein et al.

(10) Patent No.: US 8,314,547 B2
(45) Date of Patent: Nov. 20, 2012

(54) OPTO-ELECTRONIC COMPONENT

(75) Inventors: Markus Klein, Tegernheim (DE);
Norwin Von Malm, Nittendorf (DE);
Benjamin Claus Krummacher,
Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 33 days.

(21) Appl. No.: 12/679,138

(22) PCT Filed: Aug. 4, 2008

(86) PCT No.: PCT/DE2008/001302
§ 371 (c)(1),
(2), (4) Date: Nov. 23, 2010

(87) PCT Pub. No.: WO2009/036718
PCT Pub. Date: Mar. 26, 2009

(65) Prior Publication Data
US 2011/0133628 A1    Jun. 9, 2011

(30) Foreign Application Priority Data

Sep. 19, 2007 (DE) .......................... 10 2007 044 597

(51) Int. Cl.
*H01L 51/00* (2006.01)
(52) U.S. Cl. ........................................ 313/504; 313/512
(58) Field of Classification Search .......... 313/498–512;
428/690
See application file for complete search history.

(56) References Cited

U.S. PATENT DOCUMENTS

| | | | |
|---|---|---|---|
| 6,309,486 | B1 | 10/2001 | Kawaguchi et al. |
| 6,616,862 | B2 | 9/2003 | Srivastava et al. |
| 6,670,748 | B2 | 12/2003 | Ellens et al. |
| 7,029,602 | B2 | 4/2006 | Oshio |
| 7,064,480 | B2 | 6/2006 | Bokor et al. |
| 7,119,409 | B2 | 10/2006 | Kawamura et al. |
| 7,182,664 | B2 | 2/2007 | Yanagawa |
| 7,420,323 | B2 | 9/2008 | Krummacher |

(Continued)

FOREIGN PATENT DOCUMENTS

CN    1991417    7/2007

(Continued)

OTHER PUBLICATIONS

Duggal, A. et al.: "Organic light-emitting devices for illumination quality white light", Applied Physics Letters, vol. 80, No. 19, 2002, pp. 3470-3472.

(Continued)

*Primary Examiner* — Anne Hines
(74) *Attorney, Agent, or Firm* — Cozen O'Connor (57) ABSTRACT

An optoelectronic device comprises an organic layer sequence (1), which emits an electromagnetic radiation (15) having a first wavelength spectrum during operation, and also a structured layer (2) which is disposed downstream of the organic layer sequence (1) in the beam path of the electromagnetic radiation (15) emitted by the organic layer sequence (1) and has first and second regions (2A, 2B). In this case, the first regions (2A) each have a wavelength conversion layer (3) designed to convert at least partially electromagnetic radiation (15) having the first wavelength spectrum into an electromagnetic radiation (16) having a second wavelength spectrum. Furthermore, the second regions (2B) each have a filter layer (4), which is opaque to an electromagnetic radiation having a third wavelength spectrum, which corresponds to at least one part of the second wavelength spectrum.

14 Claims, 5 Drawing Sheets

U.S. PATENT DOCUMENTS

| | | |
|---|---|---|
| 2005/0189857 A1 | 9/2005 | Kobori |
| 2005/0275342 A1 | 12/2005 | Yanagawa |
| 2006/0102913 A1 | 5/2006 | Park |
| 2006/0202613 A1 | 9/2006 | Kawaguchi et al. |
| 2007/0159061 A1* | 7/2007 | Krummacher et al. ....... 313/501 |
| 2007/0201234 A1 | 8/2007 | Ottermann |
| 2008/0048557 A1 | 2/2008 | Birnstock et al. |
| 2009/0091258 A1 | 4/2009 | Heuser et al. |

FOREIGN PATENT DOCUMENTS

| | | |
|---|---|---|
| DE | 100 36940 | 2/2002 |
| DE | 10333040 | 4/2003 |
| DE | 10200410000 | 9/2004 |
| DE | 10147040 | 2/2005 |
| DE | 10393383 | 5/2006 |
| DE | 10393384 | 6/2006 |
| DE | 102004035965 | 6/2006 |
| DE | 102007052181 | 4/2007 |
| EP | 1705729 | 9/2006 |
| EP | 1 804 092 | 7/2007 |
| JP | 10-162958 | 6/1998 |
| JP | 2007-178978 | 7/2007 |
| TW | I325187 | 10/2009 |
| WO | WO 00/33390 | 6/2000 |
| WO | WO 2006/077808 | 7/2006 |
| WO | WO 2007/051499 | 5/2007 |
| WO | WO 2008/001660 | 1/2008 |

OTHER PUBLICATIONS

Niko, A., et al.: "Red-green-blue emission of parahexaphenyl devices with color-converting media", Journal of Applied Physics, vol. 82, No. 9, 1997.

* cited by examiner

OPTO-ELECTRONIC COMPONENT

RELATED APPLICATIONS

This is a U.S. national stage of application No. PCT/DE2008/001302 filed Aug. 4, 2008.

This patent application claims the priority of German patent application 102007044597.2, filed Sep. 19, 2007, which is hereby expressly incorporated herein by reference.

FIELD OF THE INVENTION

The present invention relates to an optoelectronic device which can emit electromagnetic radiation during operation and has a desired color impression in the switched-off state.

SUMMARY OF THE INVENTION

One object of specific embodiments of the present invention is to provide an optoelectronic device comprising a wavelength conversion layer, which device can reduce or avoid an undesired color impression in a switched-off state.

An optoelectronic device in accordance with one embodiment of the invention comprises, in particular, an organic layer sequence, which emits an electromagnetic radiation having a first spectrum during operation, and also a structured layer, which is disposed downstream of the organic layer sequence in the beam path of the electromagnetic radiation emitted by the organic layer sequence and has first and second regions. In this case, the first regions each have a wavelength conversion layer designed to convert at least partially electromagnetic radiation having the first wavelength spectrum into an electromagnetic radiation having a second wavelength spectrum. Furthermore, the second regions each have a filter layer, which is at least partially opaque to an electromagnetic radiation having a third wavelength spectrum, which corresponds to at least one part of the second wavelength spectrum.

In particular, an emitted electromagnetic radiation can in this case be perceived by an observer during the operation of the optoelectronic device. Said radiation can substantially correspond to a superimposition of the electromagnetic radiation having the first wavelength spectrum, which is emitted by the second regions, and the electromagnetic radiation having the second wavelength spectrum, which is emitted by the wavelength conversion layer of the first regions.

In this case, during the operation of the optoelectronic device, the electromagnetic radiation having the first wavelength spectrum is emitted by the organic layer sequence and impinges on the first and second regions of the structured layer. In the first regions, the electromagnetic radiation having the first wavelength spectrum is converted at least partially, but in different embodiments completely, into electromagnetic radiation having the second wavelength spectrum. Although the respective filter layers in the second regions are opaque to electromagnetic radiation having the third wavelength spectrum, which corresponds to at least one part of the second wavelength spectrum, said filter layers are preferably transmissive to electromagnetic radiation having the first wavelength spectrum. A superimposition of the first and second wavelength spectra therefore occurs in the overall impression of the electromagnetic radiation emitted by the optoelectronic device.

In at least one embodiment, the structured layer is physically and/or chemically fixed to the organic layer sequence. This means, in particular, that the structured layer is applied to the organic layer sequence for example by means of an adhesive, preferably by means of a transparent adhesive, or a gel which is matched with regard to its refractive index, or has chemical, for example covalent, bonds to the organic layer sequence.

In different embodiments of the invention, the structure of the structured layer can comprise striped, crossed-striped, that is to say lattice-like, circular, triangular or rectangular, that is to say chequered, regions or regions of any desired geometry as combination of the abovementioned geometrical forms. Furthermore, the structure of the structured layer can comprise irregular patterns of regions, in particular patterns in which first and second regions have variable dimensions and forms. To put it another way, a pattern of the structured layer is formed by a respective specific arrangement of the first and second regions. The regions of the structured layer are preferably arranged laterally or alongside one another in the beam path of the optoelectronic device. That is to say that the regions are not arranged in a manner stacked one above another in the beam path, but rather adjacent to one another, by way of example.

The dimensions of the regions, for example the resolution of the regions of the structured layer, can be of the order of magnitude of less than 1 mm, preferably of the order of magnitude of 100 µm to a few 100 µm, and more preferably of the order of magnitude of less than 100 µm. Particularly for lighting applications in which the optoelectronic device is not used in combination with optical image techniques or apparatuses, it can be sufficient to make only moderate requirements of the dimensions of the regions of the structured layer.

In a further embodiment of the invention, "wavelength spectrum" or "spectrum" or "partial spectrum" denotes a spectral distribution of electromagnetic radiation having at least one spectral component having one wavelength or a plurality of spectral components having a plurality of wavelengths and/or ranges of wavelengths. A first spectrum and a second spectrum are hereinafter identical if the spectral components and the relative intensities thereof are identical in the case of the first and second spectra, where the absolute intensity of the first spectrum can deviate from the absolute intensity of the second spectrum.

In one embodiment of the invention, "partially" denotes a partial spectrum of a spectrum, for example of the first spectrum. In particular, the partial spectrum of a spectrum can consist of a part of the spectral components of this spectrum. Furthermore, "partially" can also denote a part of an intensity of a spectrum or partial spectrum.

In a further embodiment of the invention, "convert" can mean that the partial spectrum of the electromagnetic radiation having the first spectrum, which is converted at least partially into electromagnetic radiation having the second spectrum by the wavelength conversion layer, and the second spectrum are not identical. This can mean, in particular, that the second spectrum has a spectral distribution that is different than the spectral distribution of the partial spectrum of the electromagnetic radiation having the first spectrum.

Furthermore, a wavelength conversion layer can have an absorption spectrum and an emission spectrum, where the absorption spectrum and the emission spectrum are advantageously not identical. Preferably, the absorption spectrum in this case comprises the partial spectrum of the electromagnetic radiation having the first spectrum and the emission spectrum comprises the second spectrum. In particular, the absorption spectrum and the emission spectrum can each comprise further spectral components that are not contained in the partial spectrum of the electromagnetic radiation having the first spectrum and the second spectrum, respectively.

If electromagnetic radiation having a specific wavelength is incident on the wavelength conversion layer from outside or from the active region of the semiconductor layer sequence and if the absorption spectrum has a spectral component having this specific wavelength that can be absorbed by the wavelength conversion layer, then the electromagnetic radiation having this specific wavelength is emitted again, that is to say re-emitted, into electromagnetic radiation having one or more other wavelengths which are different than said specific wavelength and which are contained in the emission spectrum. In other words, in the wavelength conversion layer, an electromagnetic radiation having the second wavelength spectrum is generated from electromagnetic radiation having the first wavelength spectrum. As a result, in particular also in the case of radiation incident on the optoelectronic device from outside, it can be possible that the wavelength conversion layer, in the case of a switched-off state of the optoelectronic device, in accordance with its absorption spectrum and its emission spectrum, as a result of radiation which is incident on the optoelectronic device from outside and which can be reflected or emitted by an absorption and re-emission process described, can give an observer a color impression which can be intrinsically undesired. Said color impression can be undesired for example by virtue of the fact that it can be different than the color impression of the electromagnetic radiation emitted during the operation of the optoelectronic device.

The filter layer can be particularly advantageous in so far as the filter layer is opaque to a part of the radiation incident on the optoelectronic device from outside, wherein said part substantially corresponds to a wavelength range of the second wavelength spectrum. The remaining part of the incident electromagnetic radiation, which can pass through the filter layer, is for example reflected by the filter layer or by the organic layer sequence or an electrode in the organic layer sequence and is emitted back through the filter layer and/or the wavelength conversion layer toward the outside. Preferably, that part of the electromagnetic radiation to which the filter layer is transmissive corresponds to electromagnetic radiation having a wavelength range of the first wavelength spectrum. Consequently, even in the switched-off state, a superimposition of electromagnetic radiation having a wavelength range of the first wavelength spectrum and an electromagnetic radiation having the wavelength range of the second wavelength spectrum occurs, with the result that a desired, preferably non-yellowish, color impression is established.

In different embodiments of the invention, the filter layer is designed to convert the electromagnetic radiation having the third wavelength spectrum into an electromagnetic radiation from a non-visible wavelength range. By way of example, in the filter layer, electromagnetic radiation from a yellow wavelength range is converted into electromagnetic radiation from an infrared wavelength range. Preferably, the filter layer is in this case transparent to electromagnetic radiation having the first wavelength spectrum.

To put it another way, the filter layer is designed to convert electromagnetic radiation having the third wavelength spectrum into heat or thermal radiation, while electromagnetic radiation having the first wavelength spectrum can pass through the filter layer preferably in as unimpeded a manner as possible. This means, in particular, that the electromagnetic radiation emitted by the organic layer sequence during operation remains substantially unaffected by the filter layer.

The filter layer is therefore designed for example to absorb the electromagnetic radiation having the third wavelength spectrum. For this purpose, in different exemplary embodiments, the filter layer can have a molecular filter. In different exemplary embodiments, the filter layer can therefore also be understood as an absorption layer for electromagnetic radiation having the third wavelength spectrum.

In particular, such an embodiment can be advantageous for applications in which light-emitting devices comprising organic light-emitting diodes (OLEDs) are used, for instance as flashlight in mobile telephone applications with a camera. By way of example, such light-emitting devices can have blue OLEDs and a phosphor conversion substance. It can be the case here that the phosphor conversion substance is visible externally through a transparent cover or a lens when such a light-emitting device is not in operation, which can lead to a color impression that is undesired for esthetic reasons, for example. Although such an undesired color impression can be reduced by Fresnel optics or microlens arrays, a disturbing color impression can nevertheless still be maintained.

As an alternative or in addition, the first spectrum can for example also have a green wavelength range, and the second spectrum a red wavelength range, with the result that the optoelectronic device can likewise enable a white luminous impression for an observer during operation. In particular, the first spectrum, the second spectrum, and that part of the radiation—incident on the optoelectronic device from outside and reflected—which is not filtered out by the filter layer can also be chosen in accordance with some other desired color impression in each case during operation and in the switched-off state of the optoelectronic device.

In accordance with at least one embodiment, the wavelength conversion layer comprises at least one of the following dyes: an organic dye, an inorganic dye, perylene, coumarin and/or a fluorescent dye.

Furthermore, the organic layer sequence can be embodied in particular as an organic light-emitting diode (OLED). In this case, an OLED can have an organic layer or a layer sequence comprising at least one organic layer, having an active region that can emit electromagnetic radiation during operation. Furthermore, an OLED can have a first electrode and a second electrode, wherein the organic layer or the layer sequence comprising at least one organic layer having the active region can be arranged between the first and second electrodes. In this case, the first and the second electrode can be suitable for injecting "holes" and electrons, respectively, into the active region, which can recombine there with the emission of electromagnetic radiation.

Furthermore, the first electrode can be arranged on a substrate. The organic layer or the layer sequence comprising one or more functional layers composed of organic materials can be applied over the first electrode. The functional layers, which can comprise the active region, can in this case have electron transport layers, electroluminescent layers, and/or hole transport layers, for example. The second electrode can be applied over the functional layers or over the at least one organic layer.

By way of example, the substrate can comprise glass, quartz, plastic films, metal, metal films, silicon wafers or any other suitable substrate material. By way of example, the substrate can also be embodied as a layer sequence or laminate comprising a plurality of layers. If the semiconductor layer sequence is embodied as a so-called "bottom emitter", that is to say that the electromagnetic radiation generated in the active region can be emitted through the substrate, then the substrate can advantageously have a transparency to at least one part of the electromagnetic radiation. The wavelength conversion layer and the filter layer can in this case be arranged on a side of the substrate which is remote from the semiconductor layer sequence.

In accordance with at least one embodiment, at least one of the electrodes comprises or consists of a transparent conductive oxide, a metal or a conductive organic material.

In the bottom emitter configuration, the first electrode can advantageously be transparent to at least one part of the electromagnetic radiation. A transparent first electrode, which can be embodied as an anode and can thus serve as material that injects positive charges or "holes", can for example comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs need not necessarily correspond to a stoichiometric composition and can also be p- or n-doped. As an alternative or in addition, the first electrode can also comprise a metal, for example silver.

The semiconductor layer sequence comprising at least one organic layer can comprise polymers, oligomers, monomers, organic small molecules or other organic non-polymeric compounds or combinations thereof. In particular, it can be advantageous if a functional layer of the layer sequence is embodied as a hole transport layer in order to enable effective injection of holes into an electroluminescent layer or an electroluminescent region. Such structures concerning the active region or the further functional layers and regions are known to the person skilled in the art in particular with regard to materials, construction, function and structure, and therefore will not be explained in any greater detail at this juncture.

The second electrode can be embodied as a cathode and can thus serve as electron-inducting material. Inter alia, in particular aluminum, barium, indium, silver, gold, magnesium, calcium or lithium and compounds, combinations and alloys thereof can prove to be advantageous as cathode material. In addition or as an alternative, the second electrode can also be embodied in transparent fashion. This means, in particular, that the OLED can also be embodied as a "top emitter", that is to say that the electromagnetic radiation generated in the active region can be emitted on that side of the semiconductor layer sequence which is remote from the substrate. In this case, the wavelength conversion layer and the filter layer can be arranged above the semiconductor layer sequence and in particular above the second electrode.

If an electrode which comprises the metallic layer or consists thereof is intended to be embodied as transmissive to the light emitted by the organic layer stack, then it can be advantageous if the metallic layer is made sufficiently thin. Preferably, the thickness of such a semitransparent metallic layer lies between 1 nm and 100 nm, inclusive of the limits.

Furthermore, the first electrode can be embodied as a cathode and the second electrode as an anode, wherein the semiconductor layer sequence can in this case be embodied as a bottom or top emitter. Moreover, the semiconductor layer sequence can be embodied simultaneously as a top emitter and as a bottom emitter.

The semiconductor layer sequence can have as active region a conventional pn junction, a double heterostructure, a single quantum well structure (SQW structure) or a multiple quantum well structure (MQW structure), for example. Alongside the active region, the semiconductor layer sequence can comprise further functional layers and functional regions, for instance p- or n-doped charge carrier transport layers, that is to say electron or hole transport layers, p- or n-doped confinement or cladding layers, buffer layers and/or electrodes and combinations thereof. Such structures concerning the active region or the further functional layers and regions are known to the person skilled in the art in particular with regard to construction, function and structure, and therefore will not be explained in any greater detail at this juncture.

In a further embodiment, the wavelength conversion layer comprises at least one wavelength conversion substance. In this case, the wavelength conversion substance can comprise for example particles from the group of cerium-doped garnets, in this case in particular cerium-doped yttrium aluminum garnet ($Y_3Al_5O_{12}$:Ce, YAG:Ce), cerium-doped terbium aluminum garnet (TAG:Ce), cerium-doped terbium yttrium aluminum garnet (TbYAG:Ce), cerium-doped gadolinium yttrium aluminum garnet (GdYAG:Ce) and cerium-doped gadolinium terbium yttrium aluminum garnet (GdTbYAG:Ce). Further possible wavelength conversion substances can be the following, for example:

garnets of the rare earths and of the alkaline earth metals, as described for example in the document US 2004062699 A1, the disclosure content of which in this regard is incorporated by reference, nitrides, sions and sialons, as described for example in the document DE 10147040 A1, the disclosure content of which in this regard is incorporated by reference, orthosilicates, sulfides and vanadates, as described for example in the document WO 00/33390 A1, the disclosure content of which in this regard is incorporated by reference, chlorosilicates, as described for example in the document DE 10036940 A1, the disclosure content of which in this regard is incorporated by reference, and aluminates, oxides, halophosphates, as described for example in the document U.S. Pat. No. 6,616,862 B2, the disclosure content of which in this regard is incorporated by reference.

Furthermore, the wavelength conversion layer can also comprise suitable mixtures and combinations of the wavelength conversion substances mentioned.

Furthermore, the wavelength conversion layer can comprise a transparent matrix material, wherein the wavelength conversion substance can be embedded into the matrix material or be chemically bonded thereto. The transparent matrix material can comprise for example a transparent plastic, for instance silicones, epoxides, acrylates, imides, carbonates, olefins or derivatives thereof. In this case, the wavelength conversion layer can be embodied as a film. Furthermore, the wavelength conversion layer can also be applied on a substrate comprising glass or a transparent plastic, for instance.

In accordance with at least one embodiment of the optoelectronic device, the wavelength conversion layer comprises at least one wavelength conversion substance from the group of garnets.

In accordance with at least one embodiment of the optoelectronic device, the wavelength conversion substance is embedded into a matrix material and the matrix material comprises a transparent plastic.

In accordance with at least one embodiment of the optoelectronic device, the wavelength conversion layer is embodied as a film.

In accordance with at least one embodiment of the optoelectronic device, the second regions each have a scattering layer.

In accordance with at least one embodiment of the optoelectronic device, the scattering layer is disposed downstream of the filter layer in the beam path of the electromagnetic radiation emitted by the organic layer sequence.

In accordance with at least one embodiment of the optoelectronic device, the filter layer is disposed downstream of the scattering layer in the beam path of the electromagnetic radiation emitted by the organic layer sequence.

In accordance with at least one embodiment of the optoelectronic device, the filter layer and the scattering layer are combined with one another in the second regions.

In accordance with at least one embodiment of the optoelectronic device, a scattering layer is provided which is disposed downstream of the structured layer in the beam path of the electromagnetic radiation emitted by the organic layer sequence.

In accordance with at least one embodiment of the optoelectronic device, the scattering layer has a roughened surface.

In accordance with at least one embodiment of the optoelectronic device, the scattering layer comprises reflective particles.

In accordance with at least one embodiment of the optoelectronic device, the scattering layer comprises at least one of the following reflective particles: quartz glass, titanium oxide, aluminum oxide.

In a further embodiment of the invention, the second regions each have a scattering layer designed to pass on or emit electromagnetic radiation, in particular light, which impinges on the layer in directional fashion, in non-directional fashion, that is to say with different directions.

The organic layer sequence usually emits electromagnetic radiation in directional form, that is to say that the electromagnetic radiation emitted by the organic layer sequence has predominantly a single direction, which is substantially perpendicular to the layer arrangement of the organic layer sequence. In different exemplary embodiments, the electromagnetic radiation emitted by the wavelength conversion layer can be effected in non-directional or isotropic fashion. The electromagnetic radiation having the first spectrum, which is emitted by the organic layer sequence, is also emitted in non-directional fashion by the scattering layer. Consequently, in the case of a superimposition of the isotropically emitted electromagnetic radiation having the second spectrum and the electromagnetic radiation having the first spectrum that is scattered by the scattering layer, a superimposition of in each case non-directional electromagnetic radiation occurs. This advantageously leads to a uniform light impression of the optoelectronic device.

The scattering layer can be disposed downstream of the filter layer in the beam path of the electromagnetic radiation emitted by the organic layer sequence. As an alternative, the filter layer can also be disposed downstream of the scattering layer in the beam path of the electromagnetic radiation emitted by the organic layer sequence. Once again as an alternative, the filter layer and the scattering layer can be combined with one another in the second regions.

In a further exemplary embodiment, a directional electromagnetic radiation can also be emitted by the wavelength conversion layer. For this case, in particular, it can be expedient to provide a scattering layer which is disposed downstream of the structured layer, that is to say downstream of the first and the second regions, in the beam path of the electromagnetic radiation emitted by the organic layer sequence. The scattering layer once again converts directional light or directional electromagnetic radiation from the first and second regions into non-directional radiation. This can lead to a more pleasant color impression for an observer, for example.

In different exemplary embodiments, the scattering can be achieved by virtue of the fact that the scattering layer has a roughened surface. In other exemplary embodiments, the scattering layer can comprise reflective particles for scattering purposes, which particles reflect incident light at respectively different emission angles, for example. In this case, the reflective particles can be formed for example by quartz glass, by titanium dioxide, by aluminum oxide or similar transparent particles. In this case, the particles preferably have a particle size in the range of from approximately 100 nm to a few μm. In this case, the particles are preferably embedded into a matrix, for example a film or a silicone matrix. As an alternative, other transparent plastics can also be used as carrier material for the reflective particles.

In a further embodiment of the invention, the optoelectronic device has a second wavelength conversion layer, which is disposed downstream of the first regions and/or the second regions in the beam path of the electromagnetic radiation emitted by the organic layer sequence. In this case, the second wavelength conversion layer is designed to convert at least partially electromagnetic radiation from a wavelength range lying below a wavelength range of the first spectrum into an electromagnetic radiation from the wavelength range of the first spectrum. What can be achieved by means of the conversion of the electromagnetic radiation from the wavelength range lying below the wavelength range of the first spectrum and thus usually in a non-visible wavelength range into the wavelength range of the first spectrum is that, in the case of incidence of electromagnetic radiation on the optoelectronic device from outside, the intensity of the electromagnetic radiation in the wavelength range of the first spectrum is correspondingly amplified. In this case, the light converted by the second wavelength conversion layer, depending on the embodiment chosen, can be reflected by the second region and emitted toward the outside and/or be converted in the first regions with the first wavelength conversion layer into electromagnetic radiation having a wavelength range corresponding to the second wavelength spectrum. Preferably, the second wavelength conversion layer is designed to convert electromagnetic radiation from an ultraviolet (UV) wavelength range into an electromagnetic radiation from a blue wavelength range.

Consequently, in the case of an optoelectronic device in accordance with one of the embodiments, in the case of irradiation with sunlight, a UV portion of the sunlight can firstly be converted into electromagnetic radiation from a blue wavelength range, which, by itself or together with a subsequent electromagnetic radiation converted into a yellow wavelength range, increases an intensity of the luminous impression of the optoelectronic device.

In a further exemplary embodiment of the invention, the first regions each have a second filter layer, which is disposed downstream of the first wavelength conversion layer in the second regions in the beam path of the electromagnetic radiation emitted by the organic layer sequence. In this case, the second filter layer is at least partially opaque to an electromagnetic radiation having a fourth wavelength spectrum, which corresponds to at least one part of the first wavelength spectrum. What can advantageously be achieved by means of the second filter layer is that less or no electromagnetic radiation from a wavelength range corresponding to the absorption spectrum of the first wavelength conversion layer is converted into electromagnetic radiation having the second wavelength spectrum in said wavelength conversion layer. Consequently, the intensity of the electromagnetic radiation having the second wavelength spectrum which is emitted by the wavelength conversion layer can be reduced. This can lead to a less yellowish color impression of the optoelectronic device.

In different embodiments, the second filter layer can be designed at least partially to absorb the electromagnetic radiation having the fourth spectrum. As an alternative or in addition, the second filter layer can also be designed at least partially to reflect the electromagnetic radiation having the fourth spectrum.

For different exemplary embodiments of the invention in which the organic layer sequence is embodied as a top emitter structure, the optoelectronic device can have an encapsulation disposed upstream or disposed downstream of the structured layer in the beam path of the electromagnetic radiation emitted by the organic layer sequence. To put it another way, the structured layer can be encapsulated jointly with the organic layer sequence or, as an alternative, lie outside an encapsulation of the organic layer sequence. The encapsulation can in each case be embodied as a thin-film encapsulation.

The second wavelength conversion layer can have a similar construction to the first wavelength conversion layer. In particular, in the second wavelength conversion layer, it is possible to provide corresponding conversion substances which, however, are adapted in terms of their arrangement and/or composition and/or concentration to the absorption spectrum and emission spectrum desired in the second wavelength conversion layer.

The filter layers can also be embodied as corresponding conversion layers, wherein the portions of the electromagnetic radiation that are respectively to be filtered out are in each case preferably converted into electromagnetic radiation from a non-visible wavelength range, preferably an infrared wavelength range. As an alternative, the filter layers can also be realized as pigment-based filters comprising corresponding colored pigments for the filtering.

DETAILED DESCRIPTION OF THE DRAWINGS

In the exemplary embodiments and figures, identical or identically acting constituent parts are in each case provided with the same reference symbols. The elements illustrated and their size relationships among one another should not be regarded as true to scale, in principle; rather, individual elements, such as layers for example, may be illustrated with an exaggerated thickness for the sake of improved illustration and/or in order to afford a better understanding.

Figure 1A:
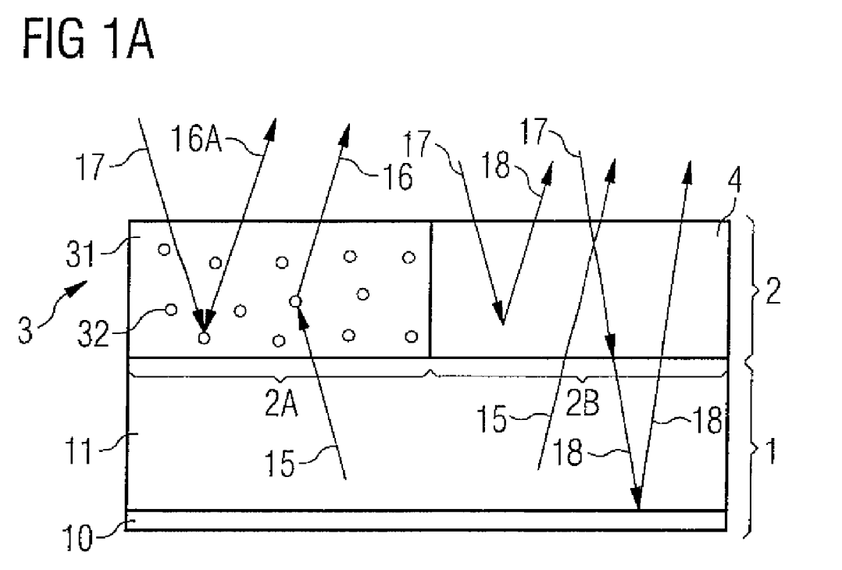
FIGS. 1A and 1B show schematic illustrations of an optoelectronic device in accordance with one exemplary embodiment during operation and in the switched-off state.
Figure 1B:
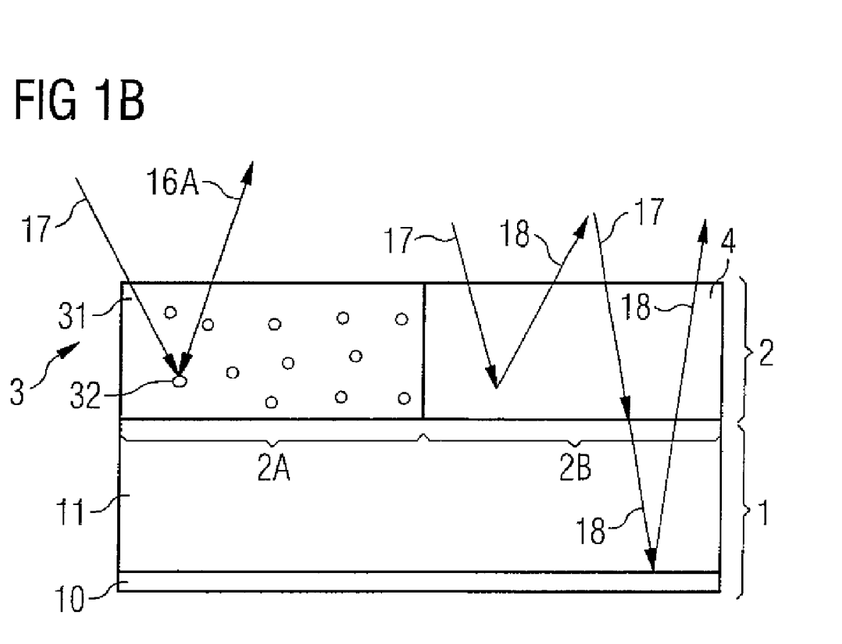

FIGS. 1A and 1B show an exemplary embodiment of an optoelectronic device. In this case, the optoelectronic device is described during operation in conjunction with FIG. 1A, while FIG. 1B shows the optoelectronic device in the switched-off state. The following description can relate equally to FIGS. 1A and 1B.

The optoelectronic device has an organic layer sequence 1 and an electrode 10 and an active region 11. In this case, as explained in the general part of the description, the organic layer sequence 1 can have functional layers or layer sequences and is embodied as an OLED, for example. In particular, the active region 11 of the organic layer sequence 1 is suitable for emitting electromagnetic radiation 15 having a first wavelength spectrum.

A structured layer comprising a first region 2A and a second region 2B is arranged in the beam path of the electromagnetic radiation 15 having the first wavelength spectrum. The first region 2A has a wavelength conversion layer 3 comprising a wavelength conversion substance 32. As shown in the exemplary embodiment, the wavelength conversion substance 32 can be embedded into a matrix material 31, for example. The second region 2B has a fourth layer 4.

In this case, the wavelength conversion substance 32 is suitable for converting at least partially a partial spectrum of the electromagnetic radiation 15 having the first wavelength spectrum into electromagnetic radiation 16 having a second wavelength spectrum. In this case, suitable materials for the wavelength conversion substance 32 can be, in particular, materials which have an absorption spectrum which contains at least one spectral component, in particular one wavelength range, which is also contained in the first wavelength spectrum. The absorbed electromagnetic radiation can then preferably be re-emitted with a different wavelength than the electromagnetic radiation 15 having the first wavelength spectrum.

The filter layer 4 is opaque to an electromagnetic radiation having a third wavelength spectrum, which corresponds to at least one part of the second wavelength spectrum. In this exemplary embodiment, the electromagnetic radiation 15 having the first wavelength spectrum can pass through the filter layer 4 in an unimpeded manner and substantially without any alteration of its spectral components. To put it another way, the filter layer 4 is transparent to electromagnetic radiation 15 having the first wavelength spectrum.

By way of example, spectral components of an electromagnetic radiation 17 which is incident on the optoelectronic device from outside and which corresponds to the third wavelength spectrum are converted into an electromagnetic radiation from a non-visible wavelength range, which is not shown in the present illustration for reasons of clarity. A remaining portion of spectral components of the electromagnetic radiation 17 is, as electromagnetic radiation 18, alternatively reflected or transmitted through the filter layer 4 into the organic layer sequence 1, wherein in this case this electromagnetic radiation 18 is reflected at the electrode 10 back through the filter layer 4. By way of example, the wavelength range of the electromagnetic radiation 18 corresponds to the wavelength range of the first wavelength spectrum of the electromagnetic radiation 15 emitted by the organic layer sequence. In this case, the electromagnetic radiation 15 and/or the electromagnetic radiation 18 can comprise a blue wavelength range.

In the first region 2A or in the conversion layer 3, spectral components of the electromagnetic radiation 17 which correspond to the wavelength range of the first wavelength spectrum or to the absorption spectrum of the wavelength conversion layer 3 are converted into electromagnetic radiation 16 having the second wavelength spectrum by the wavelength conversion substance 32.

Consequently, in accordance with the exemplary embodiment illustrated in FIG. 1A, during the operation of the device, the electromagnetic radiation emitted by the optoelectronic device comprises portions of the electromagnetic radiation 15 having the first wavelength spectrum, portions of the electromagnetic radiation 16 having the second wavelength spectrum, which results from the conversion of the electromagnetic radiation 15, portions of the electromagnetic radiation 18 filtered by the filter layer 4, and portions of the electromagnetic radiation 16A, which results from the conversion of the incident electromagnetic radiation 17. Advantageously, this results in an electromagnetic radiation from a yellow wavelength range combined with an electromagnetic radiation from a blue wavelength range, which results in a desired, for example whitish, emission characteristic.

In the switched-off state of the optoelectronic device, as illustrated in the exemplary embodiment of FIG. 1B, electromagnetic radiation 17 is once again incident on the device from outside. As described above, in the wavelength conversion layer 3 the electromagnetic radiation 17 is converted into electromagnetic radiation 16A, and in the filter layer 4 the incident electromagnetic radiation 17 is filtered, resulting in the filtered electromagnetic radiation 18. Consequently, once again through combination of a yellowish portion of the electromagnetic radiation 16A and a bluish portion of the electromagnetic radiation 18, a non-yellowish, preferably whitish, color impression arises for an observer of the optoelectronic device in the switched-off state thereof.

Figure 2:
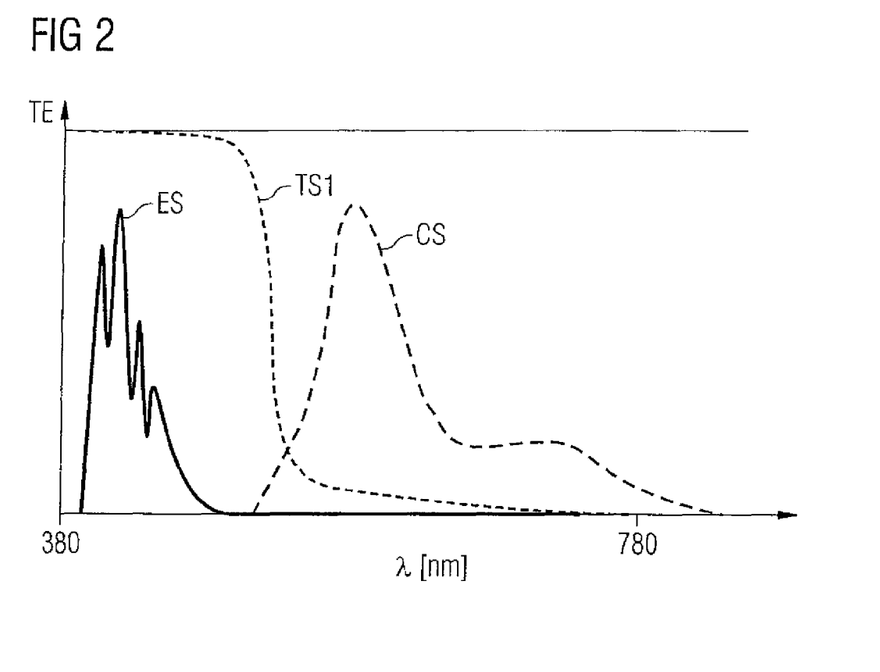
FIG. 2 shows a first exemplary spectral diagram.

FIG. 2 shows an exemplary spectral diagram with different transmission characteristics and emission characteristics as a function of a wavelength λ. An emission characteristic or an emission spectrum ES represents, for example, a spectral profile of the electromagnetic radiation 15 emitted by the organic layer sequence 1. In this case, the emission spectrum ES comprises a blue wavelength range. A conversion spectrum CS represents the wavelength spectrum which is emitted by the wavelength conversion layer 3 and on which the electromagnetic radiation 16, 16A is based, by way of example. The conversion spectrum CS accordingly comprises a yellow wavelength range and a red-green wavelength range, respectively. The curve designated by TS1 indicates a transmission spectrum of the filter layer 4. Accordingly, the filter layer 4 is transmissive to blue light and thus to the electromagnetic radiation 15 emitted by the organic layer sequence 1, while it is opaque to electromagnetic radiation having a yellow wavelength range and a red and green wavelength range. In the case of irradiation of the filter layer 4 with sunlight, for example, which approximately has spectral components in all visible wavelength ranges, a yellowish portion and reddish and greenish portion are thus filtered out. A yellowish color impression of the optoelectronic device can thus be reduced or avoided.

Figure 3:
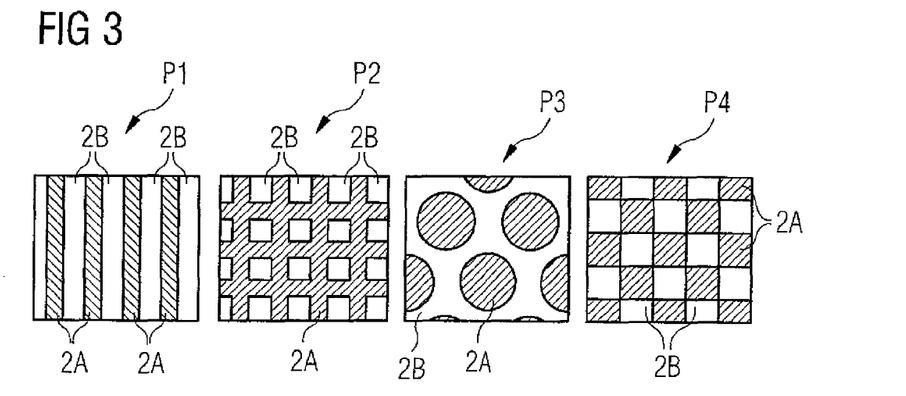
FIG. 3 shows different embodiments of a structured layer.

FIG. 3 shows different exemplary embodiments of arrangements of first and second regions 2A, 2B. In a first pattern P1, the first and second regions 2A, 2B are arranged in striped fashion, wherein a width of the respective strips can influence a color impression of the optoelectronic device. In a second pattern P2, the first and second regions 2A, 2B are arranged in crossed-striped fashion or lattice-shaped fashion. In a third pattern P3, the first regions are arranged in circular fashion within the second regions 2B. In a further exemplary pattern P4, the first and second regions 2A, 2B have a square form, thus resulting in a chequered pattern, for example. Alongside the exemplary patterns illustrated here, the first and second regions 2A, 2B can also be provided in other forms or in a combination of these and other forms.

Figure 4A:
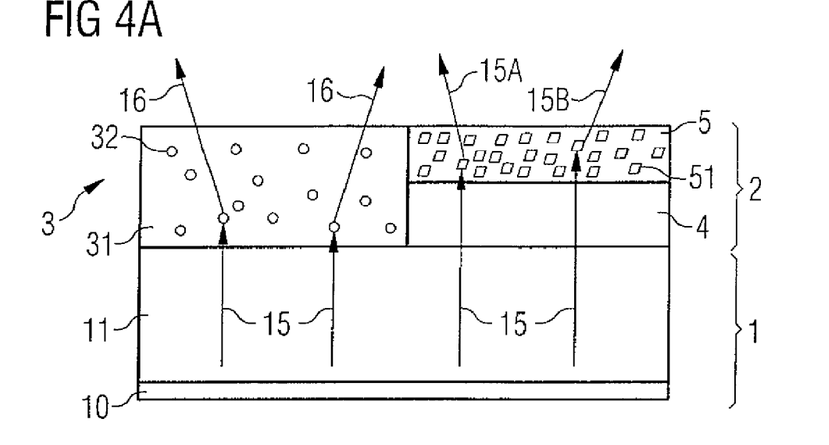
FIGS. 4A, 4B and 4C show schematic illustrations of an optoelectronic device in accordance with further exemplary embodiments.
Figure 4B:
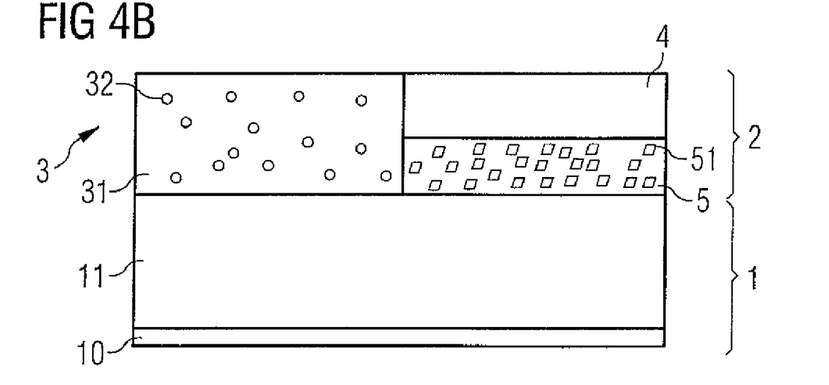
Figure 4C:
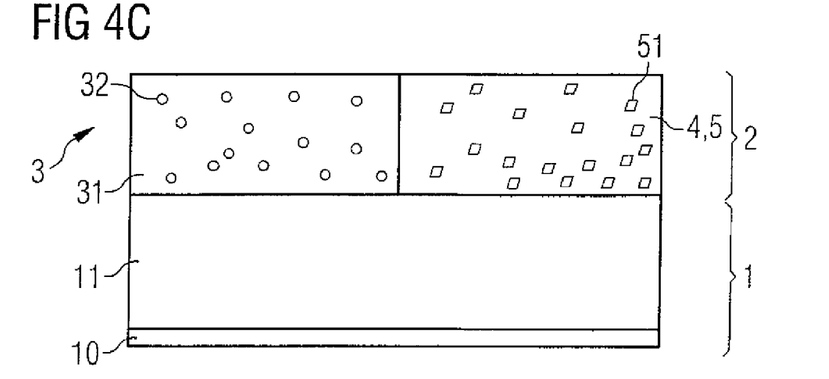

FIGS. 4A, 4B and 4C illustrate further exemplary embodiments of an optoelectronic device, the basic functioning of which corresponds to that of the exemplary embodiment in accordance with FIGS. 1A and 1B. In this case, the second regions each have a scattering layer 5, which is disposed downstream of the filter layer 4 in the beam path of the electromagnetic radiation 15 in FIG. 4A, is disposed upstream thereof in FIG. 4B, and is combined with the filter layer 4 in FIG. 4C. The following description can relate equally to FIGS. 4A, 4B and 4C.

Electromagnetic radiation 15 emitted by the organic layer sequence 1 is usually emitted as directional radiation. If the electromagnetic radiation 15 impinges on the wavelength conversion substance 32 in the wavelength conversion layer 3, the radiation is absorbed and re-emitted as electromagnetic radiation 16 having the second spectrum. In this case, the re-emission is effected in non-directional fashion, that is to say that the emission direction of the emitted radiation 16 is effected isotropically, for example. However, the electromagnetic radiation 15 passes through the filter layer 4 without any change in direction. In order to avoid a combination of directional and non-directional electromagnetic radiation, the scattering layer 5 has scattering particles 51, for example, which bring about a change in direction of the electromagnetic radiation 15, such that the latter is emitted as non-directional electromagnetic radiation 15*a*, 15*b*. Consequently, a more homogenous, more uniform color impression can be realized in the case of the optoelectronic device. The scattering layer 5 comprises a matrix material, for example, into which the reflective particles 51 are embedded. The particles can be formed from any desired transparent scattering material such as, for example, aluminum oxide, titanium dioxide or quartz glass.

The scattering effect of the scattering layer 5 also applies to an incident electromagnetic radiation 17 not illustrated here, and a reflected, filtered electromagnetic radiation 18. The scattering layer preferably has an identical emission characteristic to the wavelength conversion layer 3.

Figure 5:
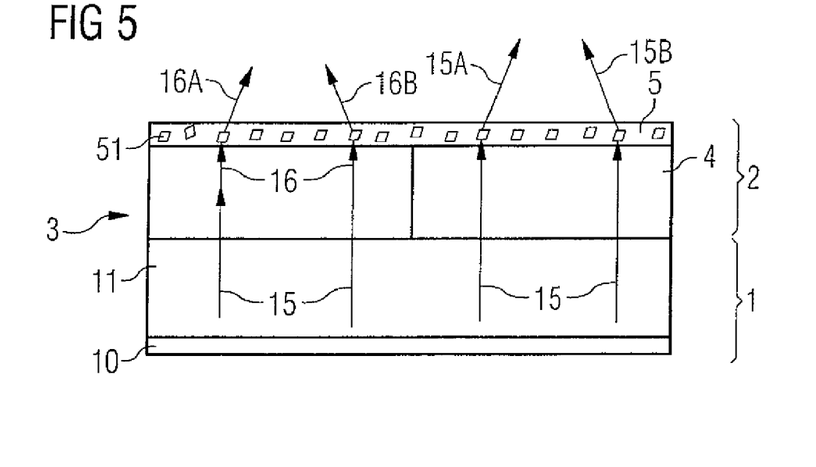
FIG. 5 shows a schematic illustration of an optoelectronic device in accordance with a further exemplary embodiment.

FIG. 5 shows a further exemplary embodiment of an optoelectronic device, in which a scattering layer 5 is provided both above the wavelength conversion layer 3 and above the filter layer 4. By way of example, in this exemplary embodiment, the wavelength conversion layer 3 is designed to emit the electromagnetic radiation 16 having the second spectrum in a directional form. In this case, electromagnetic radiation in a directional form emerges both from the wavelength conversion layer 3 and from the filter layer 4. The scattering layer 5 in the beam path of this electromagnetic radiation brings about a scattering of the radiation 15, 16 into non-directional radiation 15A, 15B, 16A, 16B. This in turn leads to a homogenous color impression of the optoelectronic device.

In this exemplary embodiment, too, the scattering layer has reflective particles 51, which correspond in terms of construction and function to the particles 51 in the exemplary embodiments shown in FIGS. 4A, 4B and 4C.

In further exemplary embodiments, the scattering layer 5 can also be realized as a layer having a roughened surface, wherein the scattering of the electromagnetic radiation 15, 16 is in this case effected by the roughened surface of the scattering layer 5. The provision of particles 51 is not absolutely necessary in this case.

Figure 6:
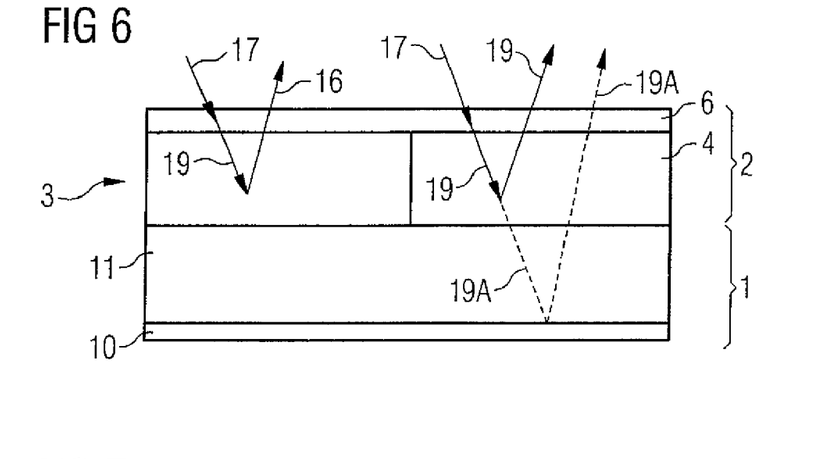
FIG. 6 shows a schematic illustration of an optoelectronic device in accordance with a further exemplary embodiment.

FIG. 6 shows a further exemplary embodiment of an optoelectronic device, in which a second wavelength conversion layer 6 is disposed downstream of the organic layer sequence 1 and the structured layer 2. In this case, the second wavelength conversion layer 6 is designed to convert at least partially electromagnetic radiation from a wavelength range lying below a wavelength range of the first spectrum into an electromagnetic radiation from the wavelength range of the first spectrum. By way of example, electromagnetic radiation from an ultraviolet wavelength range can be converted into a blue wavelength range of the first spectrum by means of the second wavelength conversion layer 6.

In this case, the second conversion layer 6 has, in principle, a similar construction or a similar composition to the first wavelength conversion layer 3, the absorption spectra and emission spectra of the first and second wavelength conversion layers 3, 6 respectively differing from one another. The second wavelength conversion layer 6 accordingly has for example an absorption spectrum from the ultraviolet wavelength range and an emission spectrum from the blue wavelength range.

By way of example, during operation or in the switched-off state of the optoelectronic device, electromagnetic radiation 17, for example sunlight, falls onto the second wavelength conversion layer 6 of the device. The spectral portions from the ultraviolet wavelength range of the electromagnetic radiation 17 which correspond to the absorption spectrum of the second wavelength conversion layer 6 are thus converted into an electromagnetic radiation 19 in accordance with the emission spectrum of the second wavelength conversion layer 6. Remaining spectral portions of the electromagnetic radiation 17, which do not correspond to the absorption spectrum of the second wavelength conversion layer 6, can for example pass through the layer 6 substantially without being altered, this not being illustrated for reasons of clarity in FIG. 6.

Since the emission spectrum of the wavelength conversion layer 6 substantially corresponds to the absorption spectrum of the first wavelength conversion layer 3, the electromagnetic radiation 19, in the first wavelength conversion layer 3, is converted into electromagnetic radiation 16 having the second spectrum and emitted. The electromagnetic radiation 19 can be reflected in the filter layer 4. As an alternative or in addition, the electromagnetic radiation 19 can also be transmitted as electromagnetic radiation 19A having the same or an altered wavelength spectrum into the organic layer sequence 1, where it is reflected toward the outside at the electrode 10, by way of example. Since the converted electromagnetic radiation 16 from a yellow wavelength range and the converted electromagnetic radiation 19 and/or 19A from a blue wavelength range are emitted jointly, a whitish color impression of the optoelectronic device once again arises as a result of these radiation portions, both in the switched-off state and in the switched-on state.

In further exemplary embodiments, the second wavelength conversion layer 6 can also be arranged only above the first regions 2A or only above the second regions 2B.

Figure 7:
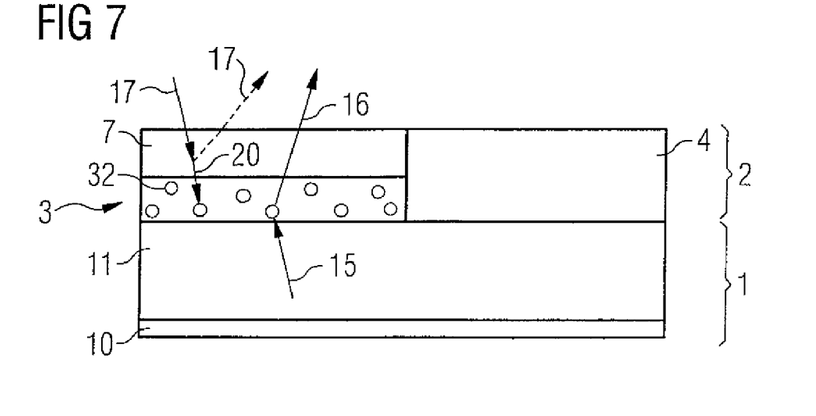
FIG. 7 shows a schematic illustration of an optoelectronic device in accordance with a further exemplary embodiment.

In a further exemplary embodiment in FIG. 7, a second filter layer is disposed downstream of the first wavelength conversion layer 3 in the beam path of the electromagnetic radiation 15 emitted by the organic layer sequence. In this case, the second filter layer 7 is opaque to an electromagnetic radiation having a fourth wavelength spectrum, which corresponds to at least one part of the first wavelength spectrum. This can advantageously prevent a situation in which electromagnetic radiation having spectral portions from the absorption spectrum of the first wavelength conversion layer 3 penetrates into the wavelength conversion layer 3 from outside the optoelectronic device. Accordingly, said spectral portions also cannot be converted into electromagnetic radiation having the second wavelength spectrum. This leads to a reduction of the emission of electromagnetic radiation from a yellowish wavelength range.

The second filter layer 7 can for example reflect the electromagnetic radiation having the fourth spectrum. As an alternative or in addition, the second filter layer 7 can also absorb the electromagnetic radiation having the fourth spectrum. By way of example, the second filter layer 7 has a spectral characteristic complementary to the first filter layer 4.

In the exemplary embodiment in FIG. 7, the electromagnetic radiation 15 emitted by the organic layer sequence is converted into electromagnetic radiation 16 having the second spectrum in the wavelength conversion layer 3. Incident electromagnetic radiation 17, at the second filter layer 7, without being altered, by way of example, is reflected or transmitted in such a way that an electromagnetic radiation 20 having a remaining spectrum impinges on the first wavelength conversion layer 3. However, since the electromagnetic radiation 20 has substantially no spectral portions from the absorption spectrum of the wavelength conversion layer 3, no re-emission of converted electromagnetic radiation can occur.

Figure 8:
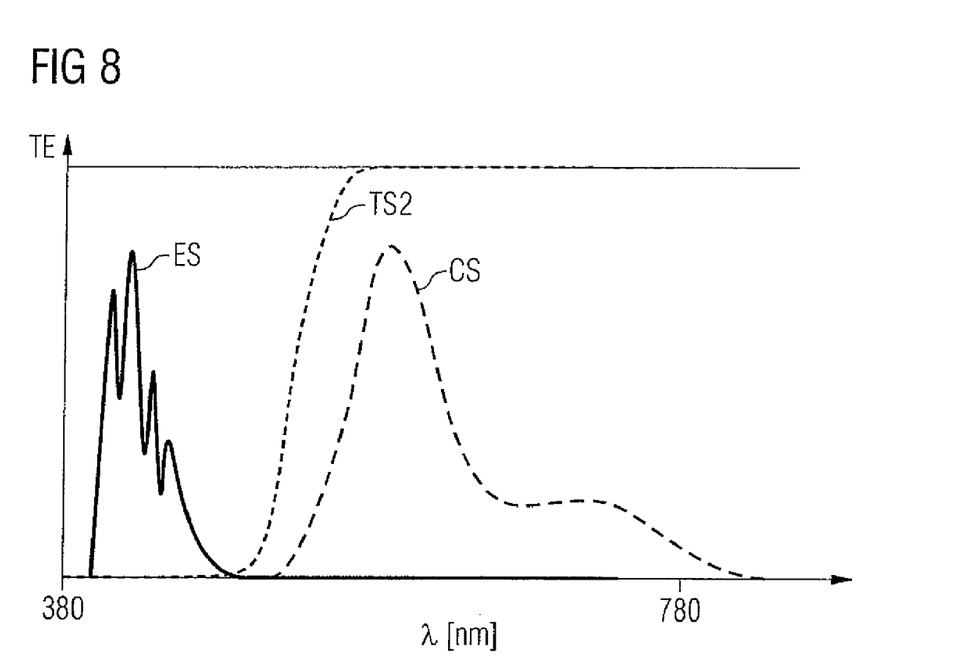
FIG. 8 shows a second exemplary spectral diagram.

FIG. 8 shows a further exemplary spectral diagram with transmission and emission spectra. In this case, the emission spectrum ES of the organic layer sequence 1 and the conversion spectrum CS of the first wavelength conversion layer 3 correspond for example to the spectral profiles shown in FIG. 2. A transmission spectrum TS2 represents the exemplary spectral profile of the second filter layer 7. The second filter layer is accordingly opaque to electromagnetic radiation having the emission spectrum of the organic layer sequence, which substantially corresponds to the absorption spectrum of the wavelength conversion layer 3.

An optoelectronic device in accordance with one of the exemplary embodiments illustrated can be suitable for example as a component for a flashlight, for a mobile telephone application with a camera. Furthermore, such an optoelectronic device can also be suitable for illumination devices.

The invention is not restricted to optoelectronic devices comprising an organic layer sequence. The invention can also be used in the case of optoelectronic devices which comprise an inorganic layer sequence instead of an organic radiation-generating layer sequence. In particular, the invention can also be used in the case of inorganic light-emitting diodes.

The invention is not restricted to the exemplary embodiments by the descriptions on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments. In particular, the different embodiments of the scattering layers, of the second wavelength conversion layer and of the second filter layer can be combined with one another in any desired manner in the case of the optoelectronic device.

The invention claimed is:

1. An optoelectronic device, comprising:
   an organic layer sequence which emits an electromagnetic radiation having a first wavelength spectrum during operation; and
   a structured layer disposed downstream of the organic layer sequence in a beam path of the electromagnetic radiation emitted by the organic layer sequence and including first and second regions;
   wherein the first regions each include a wavelength conversion layer configured to convert at least partially electromagnetic radiation having a first wavelength spectrum into an electromagnetic radiation having a second wavelength spectrum;

wherein the second regions each include a filter layer which is at least partially opaque to an electromagnetic radiation having a third wavelength spectrum which corresponds to at least one part of the second wavelength spectrum;

wherein the first and second regions of the structured layer are arranged laterally in a beam path of the optoelectronic device; and wherein the filter layer is transparent to the electromagnetic radiation having the first wavelength spectrum.

2. The optoelectronic device as claimed in claim 1, wherein the first wavelength spectrum comprises a blue wavelength range and the second wavelength spectrum comprises a yellow wavelength range.

3. The optoelectronic device as claimed in claim 1, wherein the optoelectronic device has a non-yellow color impression.

4. The optoelectronic device as claimed in claim 1, wherein the filter layer is configured to convert the electromagnetic radiation having the third wavelength spectrum into an electromagnetic radiation from a non-visible wavelength range.

5. The optoelectronic device as claimed in claim 4, wherein the filter layer is further configured to absorb the electromagnetic radiation having the third wavelength spectrum.

6. The optoelectronic device as claimed in claim 1, further comprising:
a second wavelength conversion layer disposed downstream of at least one of the first regions and the second regions in the beam path of the electromagnetic radiation emitted by the organic layer sequence and is configured to convert at least partially electromagnetic radiation from a wavelength range lying below a wavelength range of the first wavelength spectrum into an electromagnetic radiation from the wavelength range of the first wavelength spectrum.

7. The optoelectronic device as claimed in claim 6, wherein the second wavelength conversion layer is configured to convert electromagnetic radiation from an ultraviolet wavelength range into an electromagnetic radiation from a blue wavelength range.

8. The optoelectronic device as claimed in claim 1, wherein the first regions each have a second filter layer disposed downstream of the wavelength conversion layer in the beam path of the electromagnetic radiation emitted by the organic layer sequence and which is at least partially opaque to an electromagnetic radiation having a fourth wavelength spectrum which corresponds to at least one part of the first wavelength spectrum.

9. The optoelectronic device as claimed in claim 8, wherein the second filter layer is configured at least partially to absorb the electromagnetic radiation having the fourth wavelength spectrum.

10. The optoelectronic device as claimed in claim 8, wherein the second filter layer is configured at least partially to reflect the electromagnetic radiation having the fourth wavelength spectrum.

11. The optoelectronic device as claimed in claim 1, further comprising:
an encapsulation one of disposed upstream and disposed downstream of the structured layer in the beam path of the electromagnetic radiation emitted by the organic layer sequence.

12. The optoelectronic device as claimed in claim 11, wherein the encapsulation comprises a thin-film encapsulation.

13. The optoelectronic device as claimed in claim 1, wherein the electromagnetic radiation which is emitted by the optoelectronic device corresponds to a superimposition of the electromagnetic radiation having the first wavelength spectrum and the electromagnetic radiation having the second wavelength spectrum.

14. The optoelectronic device as claimed in claim 1, wherein the structured layer has at least one of striped, crossed-striped, circular, triangular, and rectangular regions.

* * * * *

UNITED STATES PATENT AND TRADEMARK OFFICE
CERTIFICATE OF CORRECTION

PATENT NO. : 8,314,547 B2  
APPLICATION NO. : 12/679138  
DATED : November 20, 2012  
INVENTOR(S) : Markus Klein et al.

It is certified that error appears in the above-identified patent and that said Letters Patent is hereby corrected as shown below:

On page 2 of the Title page, Foreign Patent Documents should read:

FOREIGN PATENT DOCUMENTS  
DE ~~10200410000~~ 102004010000  9/2004

Signed and Sealed this  
Sixteenth Day of July, 2013

Teresa Stanek Rea  
*Acting Director of the United States Patent and Trademark Office*